United States Patent [19]

Judell

[11] 4,222,110
[45] Sep. 9, 1980

[54] ANALOG TO DIGITAL CONVERTER SYSTEM

[75] Inventor: Neil H. K. Judell, North Kingston, R.I.

[73] Assignee: Hewlett-Packard Company, Palo Alto, Calif.

[21] Appl. No.: 940,249

[22] Filed: Sep. 7, 1978

[51] Int. Cl.² ............... G06F 15/34; H03K 13/02
[52] U.S. Cl. ........................ 364/724; 340/347 M
[58] Field of Search ............... 364/724; 325/42; 340/347 M; 333/18

[56] References Cited

U.S. PATENT DOCUMENTS

| | | | |
|---|---|---|---|
| 3,789,199 | 1/1974 | Kotwicki | 364/724 X |
| 4,044,241 | 8/1977 | Hatley, Jr. | 364/724 |
| 4,121,295 | 10/1978 | Witt | 364/724 |

Primary Examiner—Jerry Smith
Attorney, Agent, or Firm—Donald N. Timbie

[57] ABSTRACT

Analog to digital conversion is achieved with a reduction in digitization noise and anti-aliasing by coupling an integrating A/D converter to a digital filter having more than two sections and a gain greater than two.

6 Claims, 6 Drawing Figures

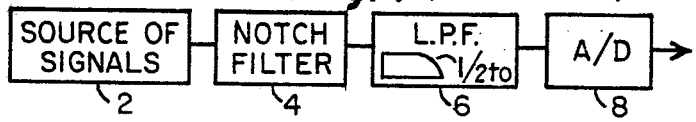
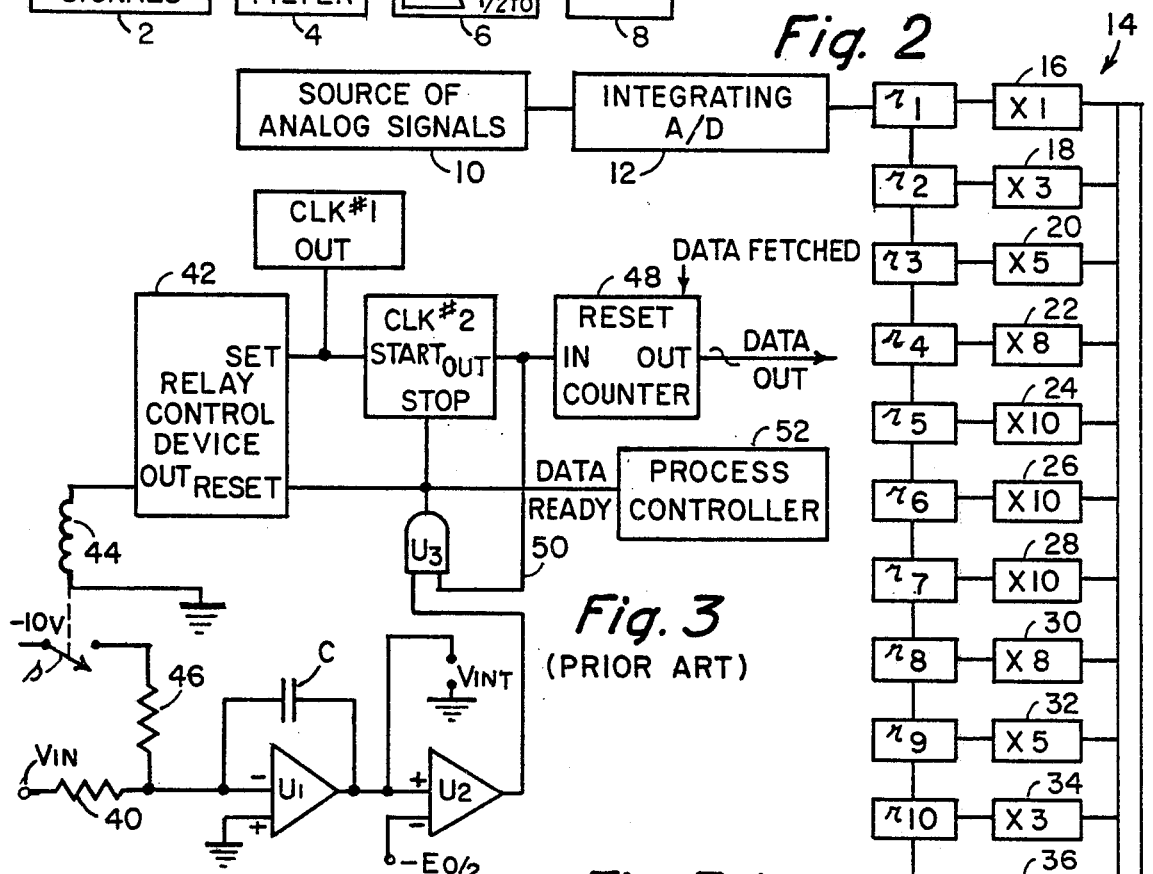
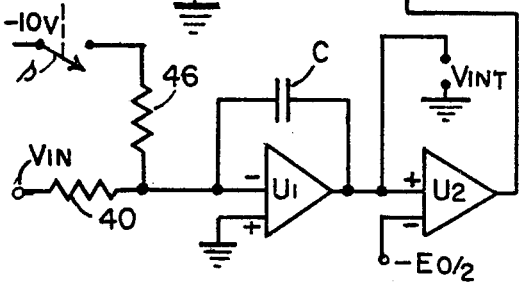
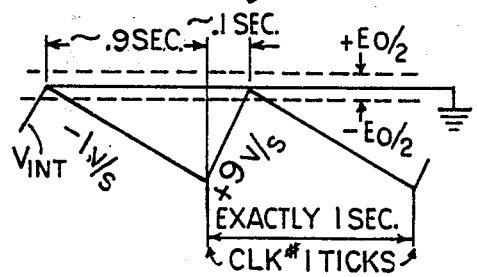
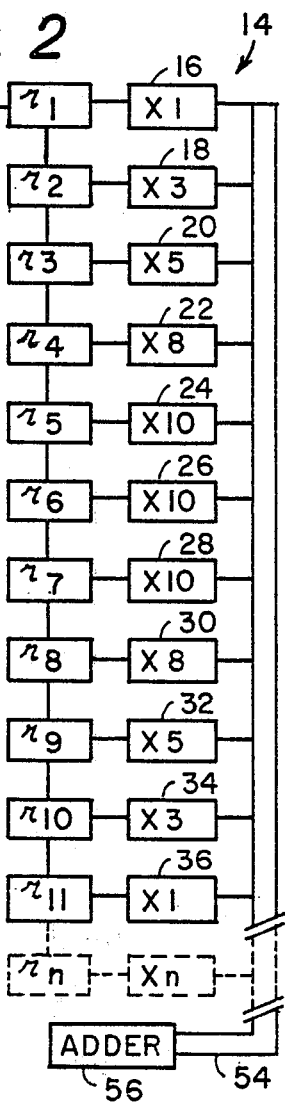
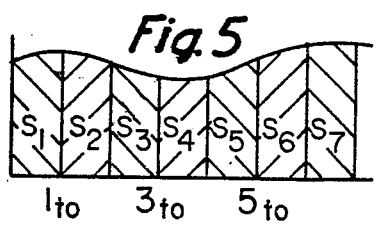
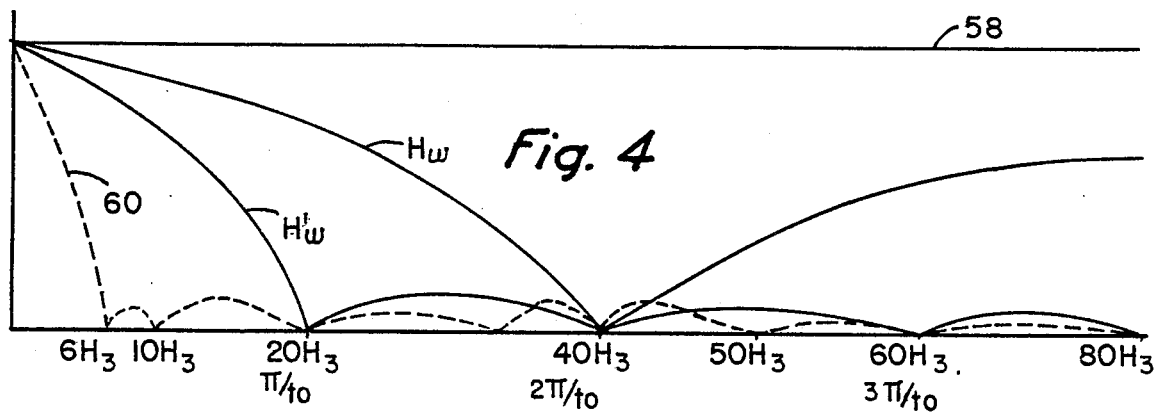

ANALOG TO DIGITAL CONVERTER SYSTEM

BACKGROUND OF THE INVENTION

Analog signals are generally translated into their digital form by applying them to analog-to-digital converters, hereinafter referred to as A/D's, before any computation or signal processing is performed. The A/D's sample the amplitude of the analog signal at intervals of $t_0$ seconds and produce digital words that represent the closest amplitude to the actual amplitude of each sample that can be attained with the number of bits used by the converter. Any difference between the actual amplitude of the sample of the analog wave and the amplitude represented by digital words derived from it is known as "digitization noise".

The highest frequency of the analog signal that can be accurately represented by such a sampling process is known as the "Nyquist frequency" and is equal to one-half the sampling frequency. If the analog signal is permitted to include higher frequencies, they can heterodyne with the sampling frequency and its harmonics to produce signals lying below the Nyquist frequency and therefore within the signal frequencies of interest. This is known as "aliasing". In order to prevent this from occurring, it has been customary to pass the analog signal through a low pass filter having a cut-off at or below the Nyquist frequency, but the sharper the cut-off, the greater the phase distortion. For this reason, it would be desirable to avoid the use of an analog filter.

In many applications, interference from power lines, at 50 Hz or 60 Hz, as the case may be, can introduce severe aliasing effects. Notch filters can be used to attenuate these frequencies in the analog signal prior to its application to an A/D converter, but they also introduce troublesome errors in phase.

BRIEF DISCUSSION OF THE INVENTION

In accordance with this invention, digitization noise and aliasing can be reduced and high attenuation of the effects of power line frequencies can be attained by utilizing an integrating A/D followed by a digital filter. For reasons that will be explained, significantly better results can be attained by use of an integrating A/D, even though it is inherently more noisy than a sample-and-hold A/D.

THE DRAWINGS

FIG. 1 is a block diagram of an A/D system of the prior art;

FIG. 2 is a block diagram of an A/D system incorporating the invention;

FIG. 3 is a simplified diagram of an integrating A/D;

FIG. 3A illustrates the operation of the integrating A/D of FIG. 3;

FIG. 4 is comprised of graphs illustrating the operation of the invention; and

FIG. 5 is used to illustrate the operation of a two-point boxcar filter.

PRIOR ART

Reference is made to the block diagram of FIG. 1 for an understanding of prior art systems for making the A/D conversion. A source 2 provides an analog signal that may include signal frequencies above the maximum frequency of interest, $\frac{1}{2}t_0$, as well as interference at fifty or sixty cycles, as the case may be, from the power lines. The effects of the latter interference may be reduced by a notch filter 4 that is coupled to the source 2, and the analog signal may be cut off at the Nyquist frequency of $\frac{1}{2}t_0$ by a low pass or anti-alias filter 6. The output of the filter 6 is applied to a sample-and-hold A/D converter 8 which samples the analog signal at intervals of $t_0$ seconds and produces digital words respectively representing the amplitudes of the analog signal at these sampling instants. As previously pointed out, an analog filter such as the filter 6 will introduce undesirable phase shifts in the analog signal that is applied to the A/D converter 8 and cause errors in the digital signal it provides.

EMBODIMENT OF THE INVENTION

FIG. 2 illustrates an analog-to-digital conversion system embodying this invention. Signals that may include signal components that are higher than the highest signal frequency of interest as well as interference from power lines that may be at 50 Hz or 60 Hz, as the case may be, are supplied from a source of analog signals 10 to an integrating A/D converter 12. The output of the converter 12 is applied to a digital filter 14. Although the particular details of the manner in which the filter 14 carries out the functions required by this invention is not important to this invention, the filter is illustrated as being comprised of a shift register having sections $r_1, r_2, r_3, r_4, r_5, r_6, r_7, r_8, r_9, r_{10}, r_{11}$, and $r_n$ with their outputs respectively connected to multipliers 16, 18, 20, 22, 24, 26, 28, 30, 32, 34, 36, and $X_n$. The outputs of the multipliers are coupled via separate leads in a harness 54 to the input of an adder 56. The multiplying factors for each of the multipliers 16–36 are for one particular digital filter that is useful in carrying out this invention, but as will be explained, other digital filters having different numbers of multipliers and respectively different multiplying factors may be used.

INTEGRATING A/D

The integrating A/D of FIG. 3 is simplified and impractical values of certain components are assumed in order to facilitate the explanation of the functional characteristics that relate to this invention. An analog signal $V_{IN}$ to be digitized, that is assumed to be +1 volt, is applied via a one-ohm resistor 40 to the inverting input of an operational amplifier $U_1$. Clock #1 supplies pulses that are precisely one second apart to the "set" input of a relay control device 42 which immediately provides a voltage at its "out" terminal so as to energize a relay coil 44 and close a normally open switch s. This applies −10 volts via a one-ohm resistor 46 to the inverting input of $U_1$. Its non-inverting input is connected to ground, and a one-farad capacitor C is connected between the inverting input of $U_1$ and its output, so that $U_1$ supplies an integrated voltage $V_{INT}$ to the non-inverting input of a comparator $U_2$. The inverting input of $U_2$ is connected to a voltage $-E_0/2$, $E_0$ being the voltage of one conversion step, as will be explained.

Each tick of the clock #1 starts a faster clock #2, e.g., having a frequency of 1000 Hz, that outputs pulses to the "in" terminal of a counter 48. When the integrated voltage $V_{INT}$ from $U_1$ reaches $-E_0/2$, the output of the comparator $U_2$ shifts to a high state. This is applied to one input of an AND gate $U_3$ but it cannot change until the next pulse from clock #2 reaches its other input via lead 50. When this occurs, the output of $U_3$ changes state. The output of $U_3$ is applied to the "reset" input of the relay control device 42, causing it to deenergize the relay coil 44 and permitting the switch s to open. The output of $U_3$ is also applied to a "data ready" output that is connected to a process controller 52. Although the connections are not shown, the process controller 52 causes the digital words in the stages $r_1$----$r_{11}$ of the shift register to advance to the next stage and the digital word at the output of the counter 48 to be stored in the stage $r_1$. The multipliers 16 through $X_n$ then multiply the outputs of the respective sections of the shift register to which they are connected. The outputs of the multipliers 16 through $X_n$ are applied by conductors in the harness 54 to the adder 56. When the addition is complete, a signal indicating that the data has been fetched is applied to the "reset" terminal of the counter 48.

OPERATION OF THE INTEGRATING A/D

Reference is now made to the graph of FIG. 3A wherein the horizontal line G represents ground potential and the sawtooth line $V_{INT}$ represents the voltage at the output of $U_1$. If $V_{IN}$ is +1 volt and the switch s is open, the capacitor C charges in a negative direction at the rate of one volt per second, and $V_{INT}$ does likewise. When the clock #1 ticks, the switch s closes, the capacitor C starts charging in a positive direction at a rate of 9 volts per second, the clock #2 starts ticking, and the counter 48 starts counting the ticks. $E_0$ is the voltage by which $V_{INT}$ increases in a positive direction between ticks. When $V_{INT}$ reaches $-E_0/2$, the output of $U_2$ changes state so as to increase the voltage in one of the inputs of $U_3$. However, as previously stated, $U_3$ cannot change state until the next tick of the clock #2 is applied to its other input via the lead 50. This could occur anywhere between the dotted lines $-E_0/2$ and $+E_0/2$. When it does occur, clock #2 is stopped and the count then in the counter 48 is used by the counter to output a digital word representing the size of the count and therefore the amplitude of $V_{IN}$. Until $U_3$ fires, $V_{INT}$ keeps increasing so that it can have a value anywhere between $-E_0/2$ and $+E_0/2$. When $U_3$ fires, the capacitor C is charged in a negative direction until the one-second clock #1 ticks. It can thus be seen that both ends of the +9-volt/second portion of $V_{INT}$ can vary so that the number of pulses from clock #2 that are counted by the counter 48 can change. These variations are independent variables but they are related owing to the fact that an increase in the voltage at the upper end of one 9-volt/second portion of $V_{INT}$ causes an increase in the voltage of $V_{INT}$ at the lower end of the next 9-volt/second portion of $V_{INT}$. These variations are the source of the digitization noise.

DIGITAL NOISE

It can be shown that the RMS value of the digitization noise in the system shown in FIG. 2 is $$\frac{E_0}{\sqrt{12}} \cdot \sqrt{\sum_L [h(L) - h(L-1)]^2} \tag{1}$$

wherein h(L) is the impulse response of the digital filter 14 and L is digital time.

Thus, if the signal from the integrating A/D 12 is applied to a digital filter having one section that multiplies by one and which is described as a filter (1), there is, in effect, no filtering at all. The resulting noise is calculated as follows. The impulse response of such a filter may be described as having the following values at successive digital or sample times—00100. The expression within the brackets represents the slope at any digital time L because the digital times are uniformly separated. The slopes for such a filter can be expressed as the difference in response at one digital time and the response at the previous time, so that slopes for the filter just described are 0, 0, 1, $-1$, 0, 0 and the sum of the squares of these slopes is $1^2 + (-1)^2 = 2$, so that expression (1) becomes $$\frac{E_0 \sqrt{2}}{\sqrt{12}} = \frac{E_0}{\sqrt{6}} = .41 E_0. \tag{2}$$

It can also be shown that the RMS noise of a sample-and-hold A/D followed by a digital filter may be expressed as $$\frac{E_0}{\sqrt{12}} \cdot \sqrt{\sum_L h^2(L)} \tag{3}$$

If this filter (1), which is no filter at all, is connected to the output of a sample-and-hold A/D, the RMS noise is $$\frac{E_0}{\sqrt{12}} \cdot \sqrt{1^2} = \frac{E_0}{\sqrt{12}} = .29 E_0. \tag{4}$$

Accordingly, a sample-and-hold A/D is inherently less noisy than an integrating A/D, but if we apply the same calculations to each of the A/D's followed by the digital filters described in the chart below, the results will be as tabulated.

| FILTER | SAMPLE & HOLD | INTEGRATING |
|---|---|---|
| (1) | .29 $E_O$ | .41 $E_O$ |
| (1,1) | .41 $E_O$ | .41 $E_O$ |
| (1,1,1,1,1,1,1,1) | .82 $E_O$ | .41 $E_O$ |
| (1,3,7,13,16,13,7,3,1) | 7.7 $E_O$ | 3.3 $E_O$ |
| (1,2,4,7,11,14,16,18,16,14,11 7,4,2,1) | 11.6 $E_O$ | 2.8 $E_O$ |
| (1,3,5,8,10,10,10,8,5,3,1) | 6.4 $E_O$ | 1.9 $E_O$ |

By way of example, the slopes for the last filter are 1,2,2,3,2,0,0,$-2$,$-3$,$-2$,$-2$,$-1$, the sum of the individual squares is 44, and the value of expression (1) for an integrating A/D becomes $$\frac{E_0 \sqrt{44}}{\sqrt{12}} = E_0 \frac{6.6}{3.45} = E_0 : 1.9. \tag{5}$$

The value of expression (3) for the sample-and-hold A/D when coupled to this same filter becomes $$\frac{E_0}{\sqrt{12}} \cdot \sqrt{498} = E_0 6.4.$$

This noise is 3.4 times greater.

The following table indicates the ratio of filter gain to digitization noise, the filter gain being the sum of the multiplications of the separate sections.

| FILTER | SAMPLE & HOLD | INTEGRATING |
|---|---|---|
| (1) | $\frac{3.45}{E_0}$ | $\frac{2.45}{E_0}$ |
| (1,1) | $\frac{4.9}{E_0}$ | $\frac{4.9}{E_0}$ |
| (1,1,1,1,1,1,1,1) | $\frac{9.76}{E_0}$ | $\frac{19.51}{E_0}$ |
| (1,3,7,13,16,13,7,3,1) | $\frac{8.31}{E_0}$ | $\frac{19.39}{E_0}$ |
| (1,2,4,7,11,14,16,18,16,14,11 7,4,2,1) | $\frac{11.03}{E_0}$ | $\frac{45.71}{E_0}$ |
| (1,3,5,8,10,10,10,8,5,3,1) | $\frac{10}{E_0}$ | $\frac{33.68}{E_0}$ |

Thus, if digitization noise is a problem and if no filtering is to be done, the sample-and-hold A/D should be used, but if digitization noise is a problem or filtering is to be used, the integrating A/D should be used.

ANTI-ALIASING

The frequency response of a sample-and-hold A/D is the same for all frequencies as indicated by the horizontal line 58 of FIG. 4, i.e., whatever the sampling frequency, the beat with any other frequency has the same amplitude. Therefore, alias frequencies produced by heterodyning between some undesired input frequencies and the sampling frequency of the A/D would lie in the bandwidth of the desired signals. It is for this reason that the low pass filter 6 is used in the prior art system of FIG. 1.

The frequency response for an integrating A/D can be derived as follows. If an analog circuit has an impulse response of $\mu_{-1}(t)\mu_{-1}(-t+t_0)$ wherein $\mu_{-1}(t)$ is a step function having zero value up to 0 and unity value thereafter, and wherein $\mu_{-1}(-t+t_0)$ is a step function having unity value from $-\infty$ until $t_0$ and zero thereafter, the frequency response is $$H_\omega = \frac{2e^{\frac{-j\omega t_0}{2}} \sin\frac{\omega t_0}{2}}{\omega} \quad (6)$$

If we apply a signal i(t) to this circuit and integrate over a period of $t_0$, we see that the result is the same as for a continuously integrating A/D such as shown in FIG. 3. Accordingly, we can say that such an A/D has a frequency response $H_\omega$ as given in equation (6). This is illustrated by the line $H_\omega$ of FIG. 4. Examination of equation (6) shows that $H_\omega=0$ when $\omega=2\pi/t_0$, so that the line $H_\omega$ goes to zero at this frequency. Another way of realizing that this occurs with an integrating A/D converter such as shown in FIG. 3 is to observe that $t_0$ is the sampling interval of one second and the sampling frequency is $2\pi/t_0$. If in that particular circuit, $V_{IN}$ has a frequency of one cycle per second, the output will be zero as integration over a complete cycle is zero. The line $H_\omega$ will also pass through zero at all harmonics of the sampling frequency $2\pi/t_0$. There will not be a great reduction in aliasing because most of the frequencies between $\pi/t_0$ and $2\pi/t_0$ have significant amplitude.

The impulse $\omega_{-1}(t)\omega_{-1}(-t+t_0)$ describes each of the samples $S_1---S_7$ of FIG. 5. Now, however, if we couple the output of an integrating A/D to a two-point boxcar filter, the output will be impulses $S_1+S_2$, $S_2+S_3$, $S_3+S_4$, etc. The frequency of sampling is the same, but the samples now have a duration of $2t_0$ and have an impulse response $u_{-1}(t)u_{-1}(-t+2t_0)$. The frequency response $H'_{(\omega)}$ of the integrating A/D followed by a two-point boxcar filter is given by the expression $$H'_{(\omega)} = \frac{2e^{-j\omega t_0} \sin(\omega t_0)}{\omega} \quad (7)$$

and is illustrated by the line $H'_{(\omega)}$ of FIG. 4. Such a response will reduce the aliasing because the response to frequencies above $\pi/t_0$ is quite low.

DIGITAL NOISE AND ALIASING

It can be seen from the tables of noise figures for the sample-and-hold A/D and the integrating A/D that a two-point boxcar filter does not reduce the noise, although it does improve the gain-to-noise ratio of the filter. If filters other than boxcar filters are used, however, the noise figures are better for the integrating A/D. A good noise figure and anti-aliasing can be attained by using a filter such as the last one in the charts. This is the filter illustrated in FIG. 2. Its frequency response is indicated by the dotted line 60. The more stages there are in a filter, the greater is the duration of a sample, and the lower is the frequency of the first zero response.

Furthermore, if the dotted line 60 were accurately plotted on a large scale, the response at line frequencies of 50 and 60 Hz would be very low for some distance on either side, so that these frequencies would produce very little interference, even if they varied.

It will be understood that FIG. 2 could have the number of sections and the required multipliers for any filter, e.g., fifteen sections would be required to form the filter having the best gain-to-noise ratio of $45.71/E_0$.

What is claimed is:

1. A system for digitizing an analog signal in such manner as to increase the signal to noise ratio and reduce aliasing, comprising
   a continuously integrating A/D converter, and
   a digital filter coupled to the output of said converter, said digital filter having more than two sections and a gain greater than two.

2. A system as set forth in claim 1 wherein the digital filter 1,2,4,7,11,14,16,18,16,14,11,7,4,2,1 is used.

3. A system as set forth in claim 1 wherein the digital filter 1,3,5,8,10,10,8,5,3,1 is used.

4. A system for digitizing an analog signal in such manner as to improve the signal to noise relationship and reduce interference from aliasing, comprising
   a continuously integrating A/D converter for providing at its output digitized samples of an analog signal applied to its input, and
   a digital filter having an input coupled to the output of said converter, said digital filter having means for making more than two successive digitized samples simultaneously available, means for multiplying each sample and means for adding the outputs of said latter means, the sum of the multiplication being greater than two.

5. A system as set forth in claim 4 wherein the said means for multiplying the digitized samples provides multiplications of 1,2,4,7,11,14,16,18,16,14,11,7,4,2 and 1 in order from the latest sample to the oldest, respectively.

6. A system as set forth in claim 4 wherein the said means for multiplying the digitized samples provides multiplications of 1,3,5,8,10,10,8,5,3,1 in order from the latest sample to the oldest, respectively.

* * * * *

UNITED STATES PATENT AND TRADEMARK OFFICE
CERTIFICATE OF CORRECTION

PATENT NO. : 4,222,110
DATED : September 9, 1980
INVENTOR(S) : Neil H.K. Judell

It is certified that error appears in the above-identified patent and that said Letters Patent are hereby corrected as shown below:

Column 5 line 33 in each occurrence "$\mu$" should read -- $\omega$ -- line 34 "0" should read -- $t$ -- line 35 "$\mu$" should read -- $\omega$ -- line 36 "$\infty$" should read -- $\alpha$ --;

"$t_0$" should read -- $(t+t_0)$ -- line 67 in each occurrence "u" should read -- $\omega$ --

Signed and Sealed this

Ninth Day of December 1980

[SEAL]

Attest:

SIDNEY A. DIAMOND

Attesting Officer

Commissioner of Patents and Trademarks